(12) United States Patent
Hosoya

(10) Patent No.: US 8,331,875 B2
(45) Date of Patent: Dec. 11, 2012

(54) AMPLIFIER AND COMMUNICATION APPARATUS

(75) Inventor: Masahiro Hosoya, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 275 days.

(21) Appl. No.: 12/877,497

(22) Filed: Sep. 8, 2010

(65) Prior Publication Data

US 2011/0217941 A1    Sep. 8, 2011

(30) Foreign Application Priority Data

Mar. 5, 2010 (JP) ................. 2010-049550

(51) Int. Cl.
*H04B 1/38* (2006.01)

(52) U.S. Cl. .................. 455/73; 455/67.16; 455/127.2; 330/253; 330/295

(58) Field of Classification Search .............. 455/67.16, 455/73, 127.2, 127.3, 130, 131, 139; 330/253, 330/295

See application file for complete search history.

(56) References Cited

U.S. PATENT DOCUMENTS 7,250,813 B1 * 7/2007 Yao .................... 330/9
7,952,427 B2 * 5/2011 Nagahori .............. 330/69

FOREIGN PATENT DOCUMENTS

JP    3214463    7/2001

* cited by examiner

*Primary Examiner* — Tuan H Nguyen
(74) *Attorney, Agent, or Firm* — Oblon, Spivak, McClelland, Maier & Neustadt, L.L.P.

(57) ABSTRACT

An amplifier includes first and second amplifier circuits. The first amplifier circuit amplifies positive-phase input signal to obtain a first positive-phase signal and amplifies negative-phase input signal to obtain a first negative-phase signal. The second amplifier circuit includes first and second amplifier units. The first amplifier unit amplifies positive-phase input signal to obtain a second positive-phase signal and amplifies negative-phase input signal to obtain a second negative-phase signal. The second amplifier unit amplifies positive-phase input signal to obtain a third positive-phase signal and amplifies negative-phase input signal to obtain a third negative-phase signal. The positive-phase output signal is sum of first and second positive-phase signals while the negative-phase output signal is sum of first and second negative-phase signals. Or the positive-phase output signal is sum of first positive-phase signal and third negative-phase signal while the negative-phase output signal is sum of first negative-phase signal and third positive-phase signal.

10 Claims, 11 Drawing Sheets

US 8,331,875 B2

AMPLIFIER AND COMMUNICATION APPARATUS

CROSS-REFERENCE TO RELATED APPLICATION

This application is based upon and claims the benefit of priority from Japanese Patent Application No. 2010-049550, filed on Mar. 5, 2010, the entire contents of which are incorporated herein by reference.

FIELD

Embodiments described herein relate generally to an amplifier and a communication apparatus.

BACKGROUND

A variable gain amplifier has phase characteristics varying according to gain variation. A technique of maintaining phase characteristics constant is disclosed in Japanese Patent No. 3214463. In this reference, phase characteristics of a variable gain amplifier are compensated by a correction circuit added to the variable gain amplifier. The correction circuit has inverted phase characteristics to the phase characteristics of the variable gain amplifier. The variable gain amplifier is capable of maintaining the phase characteristics constant irrespective of gain variation by varying the phase characteristics of the correction circuit corresponding to the gain of the variable gain amplifier.

However, with the technique disclosed in Japanese Patent No. 3214463, the variable gain amplifier is required to include the correction circuit. Accordingly, circuit size of the variable gain amplifier becomes larger.

BRIEF DESCRIPTION OF THE DRAWINGS

Aspects of this disclosure will become apparent upon reading the following detailed description and upon reference to the accompanying drawings. The description and the associated drawings are provided to illustrate embodiments of the invention and not limited to the scope of the invention.

DETAILED DESCRIPTION

Figure 1:
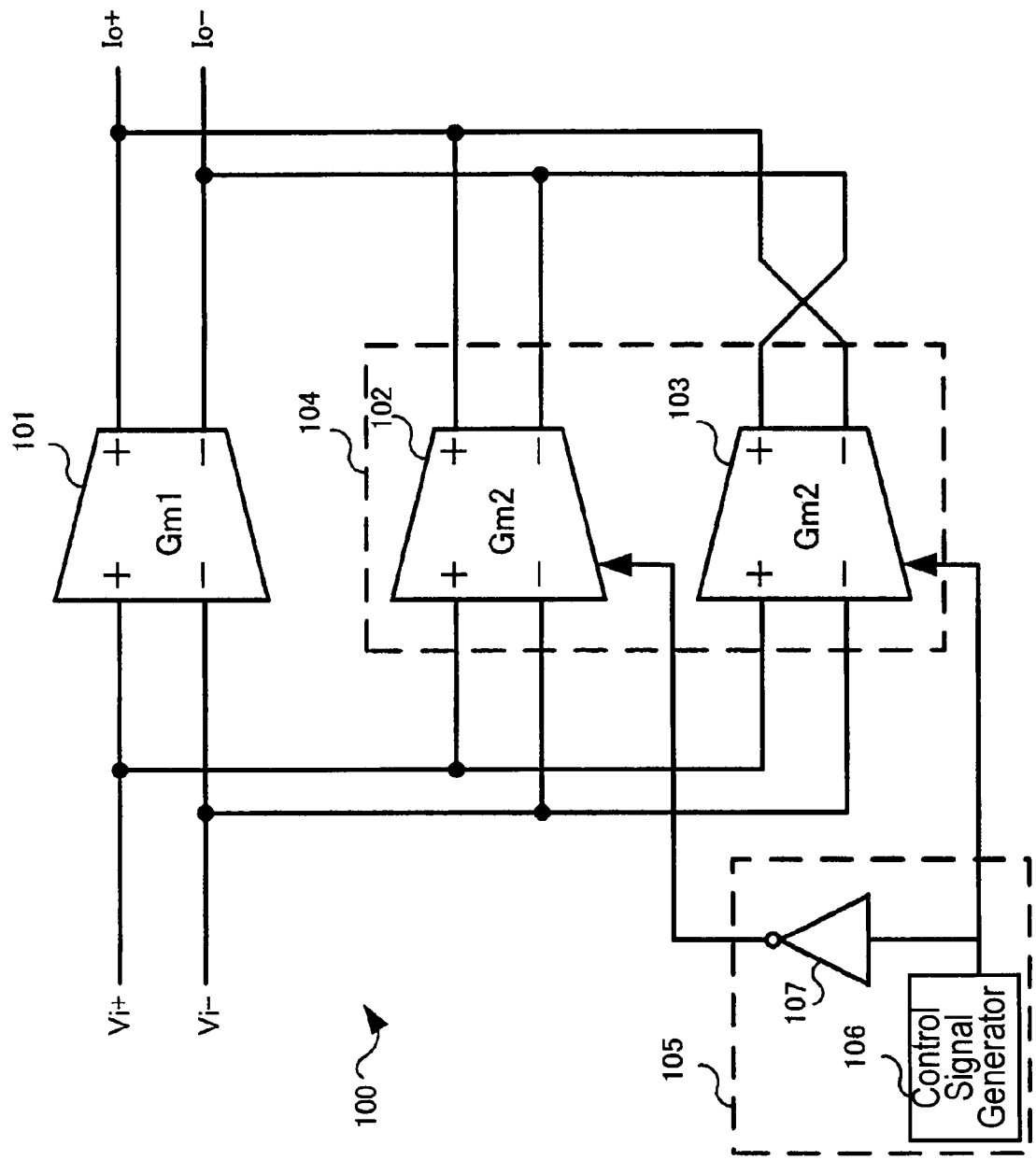
FIG. 1 is a diagram showing a configuration of an amplifier 100 according to a first embodiment.

According to one aspect of the invention, an amplifier for amplifying a positive-phase input signal to generate a positive-phase output signal and amplifying a negative-phase input signal to generate a negative-phase output signal, includes: a first amplifier circuit to amplify the positive-phase input signal in order to obtain a first positive-phase signal and to amplify the negative-phase input signal in order to obtain a first negative-phase signal; and a second amplifier circuit which includes a first amplifier unit and a second amplifier unit, the first amplifier unit amplifying the positive-phase input signal to obtain a second positive-phase signal and amplifying the negative-phase input signal to obtain a second negative-phase signal, the second amplifier unit amplifying the positive-phase input signal to obtain a third positive-phase signal and amplifying the negative-phase input signal to obtain a third negative-phase signal, wherein the positive-phase output signal is a sum of the first positive-phase signal and the second positive-phase signal while the negative-phase output signal is a sum of the first negative-phase signal and the second negative-phase signal, or the positive-phase output signal is a sum of the first positive-phase signal and the third negative-phase signal while the negative-phase output signal is a sum of the first negative-phase signal and the third positive-phase signal.

According to another aspect of the invention, an amplifier for amplifying a positive-phase input signal to generate a positive-phase output signal and amplifying a negative-phase input signal to generate a negative-phase output signal, includes a first amplifier circuit to amplify the positive-phase input signal in order to obtain a first positive-phase signal and to amplify the negative-phase input signal in order to obtain a first negative-phase signal; and a second to n-th amplifier circuits, n is an integer equal to or larger than three, each includes a first amplifier unit and a second amplifier unit, the first amplifier unit amplifying the positive-phase input signal to obtain a second positive-phase signal and amplifying the negative-phase input signal to obtain a second negative-phase signal, the second amplifier unit amplifying the positive-phase input signal to obtain a third positive-phase signal and amplifying the negative-phase input signal to obtain a third negative-phase signal, wherein the positive-phase output signal is a sum of the first positive-phase signal and the second positive-phase signal of the k-th amplifier circuit (k is an integer of two or more and n or less) while the negative-phase output signal is a sum of the first negative-phase signal and the second negative-phase signal of the k-th amplifier circuit, or the positive-phase output signal is a sum of the first positive-phase signal and the third negative-phase signal of the k-th amplifier circuit while the negative-phase output signal is a sum of the first negative-phase signal and the third positive-phase signal of the k-th amplifier circuit.

According to another aspect of the invention, a communication apparatus includes an antenna to receive a radio signal, the above amplifier to amplify the radio signal; and a receiving unit to perform signal processing on the radio signal being amplified to obtain a reception signal.

The embodiments will be explained with reference to the accompanying drawings.

Description of the First Embodiment

FIG. 1 is a diagram showing a configuration of an amplifier 100 according to a first embodiment. The amplifier 100 generates a positive-phase output signal as amplifying a positive-phase input signal. Further, the amplifier 100 generates a negative-phase output signal as amplifying a negative-phase input signal. The amplifier 100 includes a first amplifier circuit 101 to generate a first positive-phase signal as amplifying a positive-phase input signal and to generate a first negative-phase signal as amplifying a negative-phase input signal. In addition, the amplifier 100 includes a second amplifier circuit 104. The second amplifier circuit 104 includes a first amplifier unit 102 to generate a second positive-phase signal as amplifying a positive-phase input signal and to generate a second negative-phase signal as amplifying a negative-phase input signal, and a second amplifier unit 103 to generate a third positive-phase signal as amplifying a positive-phase input signal and to generate a third negative-phase signal as amplifying a negative-phase input signal.

When a positive-phase input signal is input from a positive-phase input terminal Vin+ and a negative-phase input signal is input from a negative-phase input terminal Vin−, the amplifier 100 outputs either the sum of the first positive-phase signal and the second positive-phase signal or the sum of the first positive-phase signal and the third negative-phase signal from a positive-phase output terminal Io+. Further, the amplifier 100 outputs either the sum of the first negative-phase signal and the second negative-phase signal or the sum of the first negative-phase signal and the third positive-phase signal from a negative-phase output terminal Io−.

A positive-phase output terminal of the first amplifier unit 102 of the second amplifier circuit 104 is connected to the positive-phase output terminal Io+ of the amplifier 100. A negative-phase output terminal of the first amplifier unit 102 of the second amplifier circuit 104 is connected to the negative-phase output terminal Io− of the amplifier 100. Meanwhile, a positive-phase output terminal of the second amplifier unit 103 is connected to the negative-phase output terminal Io− of the amplifier 100. A negative-phase output terminal of the second amplifier unit 103 is connected to the positive-phase output terminal Io+ of the amplifier 100.

A control signal is input to the amplifier circuit 104 from a control unit 105. In the first embodiment, the amplifier 100 includes the control unit 105. Here, the control unit 105 may be arranged at the outside of the amplifier 100. The amplifier circuit 104 activates one of the first and second amplifier units 102, 103 and deactivates the other corresponding to the control signal.

Figure 2:
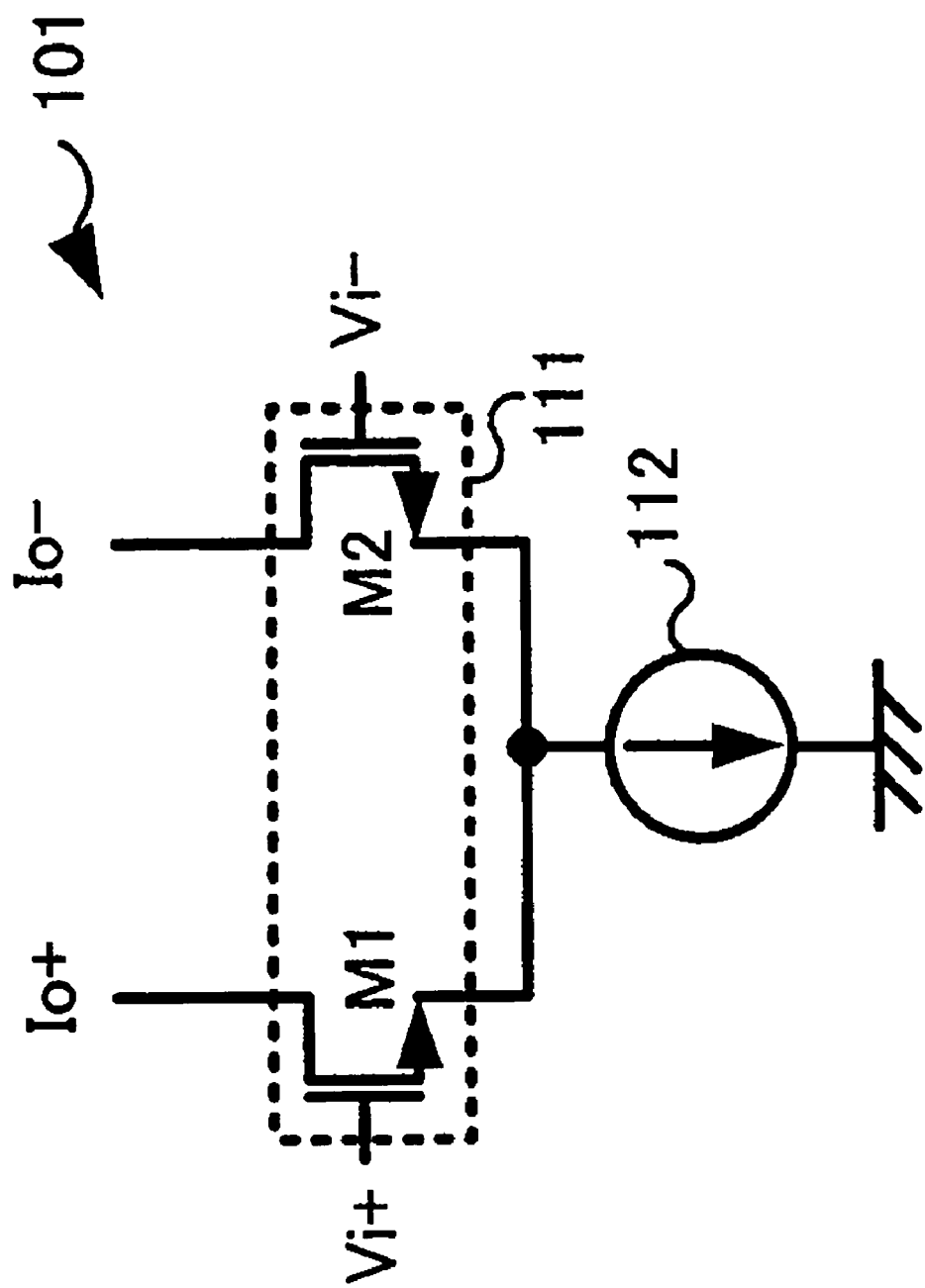
FIG. 2 is a diagram showing an example of a first amplifier circuit 101.

Next, we will explain detail of each component. FIG. 2 is a circuit diagram showing an example of the first amplifier circuit 101. The first amplifier circuit 101 is a transconductance amplifier circuit including a first pair of transistors 111 and a first current source 112. The first pair of transistors 111 includes first and second transistors M1, M2.

A gate terminal of the first transistor M1 is connected to the positive-phase input terminal Vi+. A drain terminal of the first transistor M1 is connected to the positive-phase output terminal Io+. A source terminal of the first transistor M1 is connected to the first current source 112. A gate terminal of the second transistor M2 is connected to the negative-phase input terminal Vi−. A drain terminal of the second transistor M2 is connected to the negative-phase output terminal Io−. A source terminal of the second transistor M2 is connected to the first current source 112. One end of the first current source 112 is connected to the source terminals of the first and second transistors M1, M2, respectively. The other end of the first current source 112 is grounded. Accordingly, the first current source 112 supplies current to the first and second transistors M1, M2.

The first amplifier circuit 101 includes a transconductance value gm1 and an output resistance value R1. The first amplifier circuit 101 amplifies the positive-phase input signal and the negative-phase input signal with a gain determined from the transconductance value gm1. Then, the first amplifier circuit 101 outputs the first positive-phase signal and the first negative-phase signal.

Figure 3:
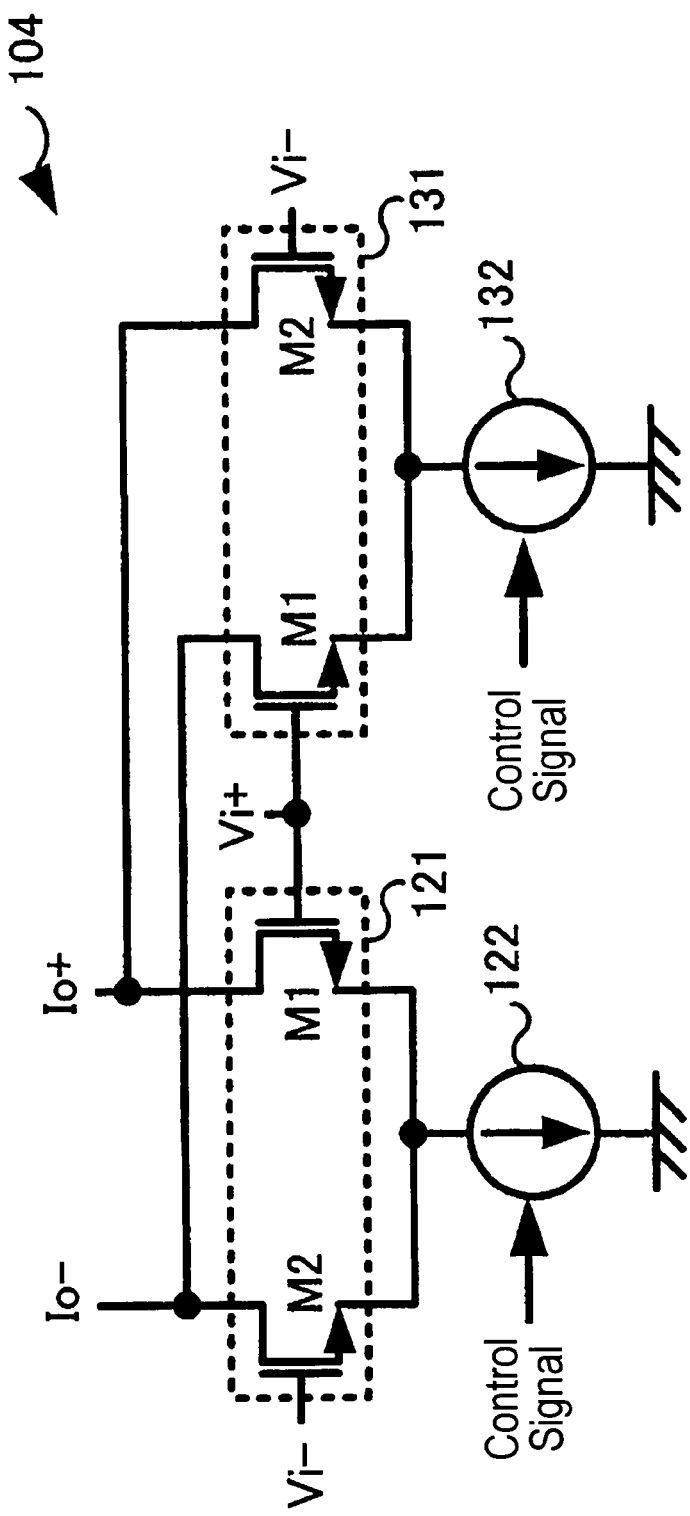
FIG. 3 is a diagram showing an example of a second amplifier circuit 104.

FIG. 3 shows an example of the second amplifier circuit 104. The first amplifier unit 102 of the second amplifier circuit 104 includes a second pair of transistors 121 having first and second transistors M1, M2, and a second current source 122. The second amplifier unit 103 includes a third pair of transistors 131 having first and second transistors M1, M2, and a third current source 132.

In the first amplifier unit 102, a gate terminal of the first transistor M1 is connected to the positive-phase input terminal Vi+. A drain terminal of the first transistor M1 is connected to the positive-phase output terminal Io+. A source terminal of the first transistor M1 is connected to the second current source 122. A gate terminal of the second transistor M2 is connected to the negative-phase input terminal Vi−. A drain terminal of the second transistor M2 is connected to the negative-phase output terminal Io−. A source terminal of the second transistor M2 is connected to the second current source 122. One end of the second current source 122 is connected to the source terminals of the first and second transistors M1, M2, respectively. The other end of the second current source 122 is grounded. Accordingly, the second current source 122 supplies current to the first and second transistors M1, M2. The second current source 122 is activated or deactivated corresponding to an inverted control signal.

The first amplifier unit 102 includes a transconductance value gm2 and an output resistance value R2. The first amplifier unit 102 amplifies the positive-phase input signal and the negative-phase input signal with an amplification factor determined from the transconductance value gm2. Then, the first amplifier unit 102 outputs the second positive-phase signal and the second negative-phase signal.

In the second amplifier unit 103, a gate terminal of the first transistor M1 is connected to the positive-phase input terminal Vi+. A drain terminal of the first transistor M1 is connected to the negative-phase output terminal Io−. A source terminal of the first transistor M1 is connected to the third current source 132. A gate terminal of the second transistor M2 is connected to the negative-phase input terminal Vi−. A drain terminal of the second transistor M2 is connected to the positive-phase output terminal Io+. A source terminal of the second transistor M2 is connected to the third current source 132. One end of the third current source 132 is connected to the source terminals of the first and second transistors M1, M2, respectively. The other end of the third current source 132 is grounded. Accordingly, the third current source 132 supplies current to the first and second transistors M1, M2. The third current source 132 is activated or deactivated corresponding to the control signal.

The second amplifier unit 103 includes a transconductance value gm2 and an output resistance value R2 being the same as those of the first amplifier unit 102. The second amplifier unit 103 amplifies the positive-phase input signal and the negative-phase input signal with an amplification factor determined from the transconductance value gm2. Then, the second amplifier unit 103 outputs the third positive-phase signal and the third negative-phase signal.

The control unit 105 generates the control signal to activate one of the second current source 122 and the third current source 132 and to deactivate the other. As shown in FIG. 1, for example, the control unit 105 includes a control signal generator 106 and an inverter 107. The control unit 105 controls the gain of the amplifier 100. The control signal generator 106 generates the control signal to activate or deactivate the third current source 132. The inverter 107 generates the inverted control signal by inverting the control signal. That is, the inverter 107 generates the inverted control signal to deactivate the second current source 122 against the control signal to activate the third current source 132. Further, the inverter 107 generates the inverted control signal to activate the second current source 122 against the control signal to deactivate the third current source 132. The control unit 105 outputs the control signal generated by the control signal generator 106 directly to the third current source 132. Further, the control unit 105 outputs the control signal generated by the control signal generator 106 to the second current source 122 via the inverter 107. Accordingly, the second and third current source 122, 132 are exclusively controlled. As a result, the second amplifier circuit 104 outputs either the second positive-phase signal and second negative-phase signal or the third positive-phase signal and third negative-phase signal. The control signal generator 106 generates the control signal when the gain of the amplifier 100 is to be varied.

Description is continued with reference to FIG. 1. In the first embodiment, the transconductance value gm1 of the first amplifier circuit 101 is set to be three times as large as the transconductance value gm2 of the first and second amplifier units 102, 103. That is, an equation of gm2=3×gm1 is satisfied. Accordingly, the first positive-phase/negative-phase signals obtained from the first amplifier circuit 101 are to be three times as large as the second and third positive-phase/negative-phase signals obtained from the first and second amplifier units 102, 103.

The first positive-phase/negative-phase signals obtained from the first amplifier circuit 101 are supplied to the positive-phase/negative-phase output terminals, respectively. Further, the signals obtained from the second amplifier circuit 104 are supplied to the positive-phase/negative-phase output terminals, respectively. The positive-phase/negative-phase output signals output from the positive-phase/negative-phase output terminals are sums of respective signals amplified by the first and second amplifier circuits 101, 104.

First, it is assumed that the second current source 122 of the second amplifier circuit 104 is activated and the third current source 132 is deactivated. That is, it is assumed that the first amplifier unit 102 is activated and the second amplifier unit 103 is deactivated. In the case, the second positive-phase/negative-phase signals are obtained from the second amplifier circuit 104. The second positive-phase signal is supplied to the positive-phase output terminal. The second negative-phase signal is supplied to the negative-phase output terminal. Further, the first positive-phase signal is supplied to the positive-phase output terminal. The first negative-phase signal is supplied to the negative-phase output terminal. Accordingly, the sum of the first positive-phase signal and the second positive-phase signal is output as the positive-phase output signal. The sum of the first negative-phase signal and the second negative-phase signal is output as the negative-phase output signal.

When magnitude of the second positive-phase/negative-phase signals obtained from the second amplifier circuit 104 is denoted by I, magnitude of the first positive-phase/negative-phase signals obtained from the first amplifier circuit 101 is to be 3×I. In the case, signals of the respective sums of the same-phase signals of the first positive-phase/negative-phase signals and the second positive-phase/negative-phase signals are to be the positive-phase/negative-phase output signals. Accordingly, magnitude of the positive-phase/negative-phase output signals is to be =4×I (=3×I+I).

Next, it is assumed that the second current source 122 of the second amplifier circuit 104 is deactivated and the third current source 132 is activated. That is, it is assumed that the first amplifier unit 102 is deactivated and the second amplifier unit 103 is activated. In the case, the third positive-phase/negative-phase signals are obtained from the second amplifier circuit 104. The third positive-phase signal is supplied to the negative-phase output terminal. The third negative-phase signal is supplied to the positive-phase output terminal. Further, the first positive-phase signal is supplied to the positive-phase output terminal. The first negative-phase signal is supplied to the negative-phase output terminal. Accordingly, the sum of the first positive-phase signal and the third negative-phase signal is output as the positive-phase output signal. The sum of the first negative-phase signal and the third positive-phase signal is output as the negative-phase output signal.

Magnitude of the third positive-phase/negative-phase signals of the second amplifier circuit 104 is to be I being the same as the magnitude of the second positive-phase/negative-phase signals. The magnitude of the first positive-phase/negative-phase signals is to be 3×I. In the case, signals of the respective sums of the opposed-phase signals of the first positive-phase/negative-phase signals and the third positive-phase/negative-phase signals are to be the positive-phase/negative-phase output signals. Accordingly, magnitude of the positive-phase/negative-phase output signals is to be 2×I (=3×I−I).

As described above, it is possible to actualize the amplifier 100 capable of outputting positive-phase/negative-phase output signals having a different gain by alternately switching the output signal of the second amplifier circuit 104.

The phase characteristics of the amplifier 100 are varied with parasitic capacities and output resistance values of the respective amplifier circuits. When parasitic capacities and output resistance values of the first and second amplifier circuits 101, 104 are varied, the phase characteristics are varied. Accordingly, the time from inputting the positive-phase/negative-phase input signals until obtaining positive-phase/negative-phase output signals (i.e., the delay time) is varied.

In the amplifier 100 according to the first embodiment, signals output from the second amplifier circuit 104 is switched by performing ON-OFF operation of the second and third current sources 122, 132 included in the second amplifier circuit 104. Then, the amplifier 100 outputs positive-phase/negative-phase output signals having a different gain. Alternately, it is possible to configure an amplifier 200 to output positive-phase/negative-phase output signals having a different gain by utilizing a switch, as shown in FIG. 4.

Figure 4:
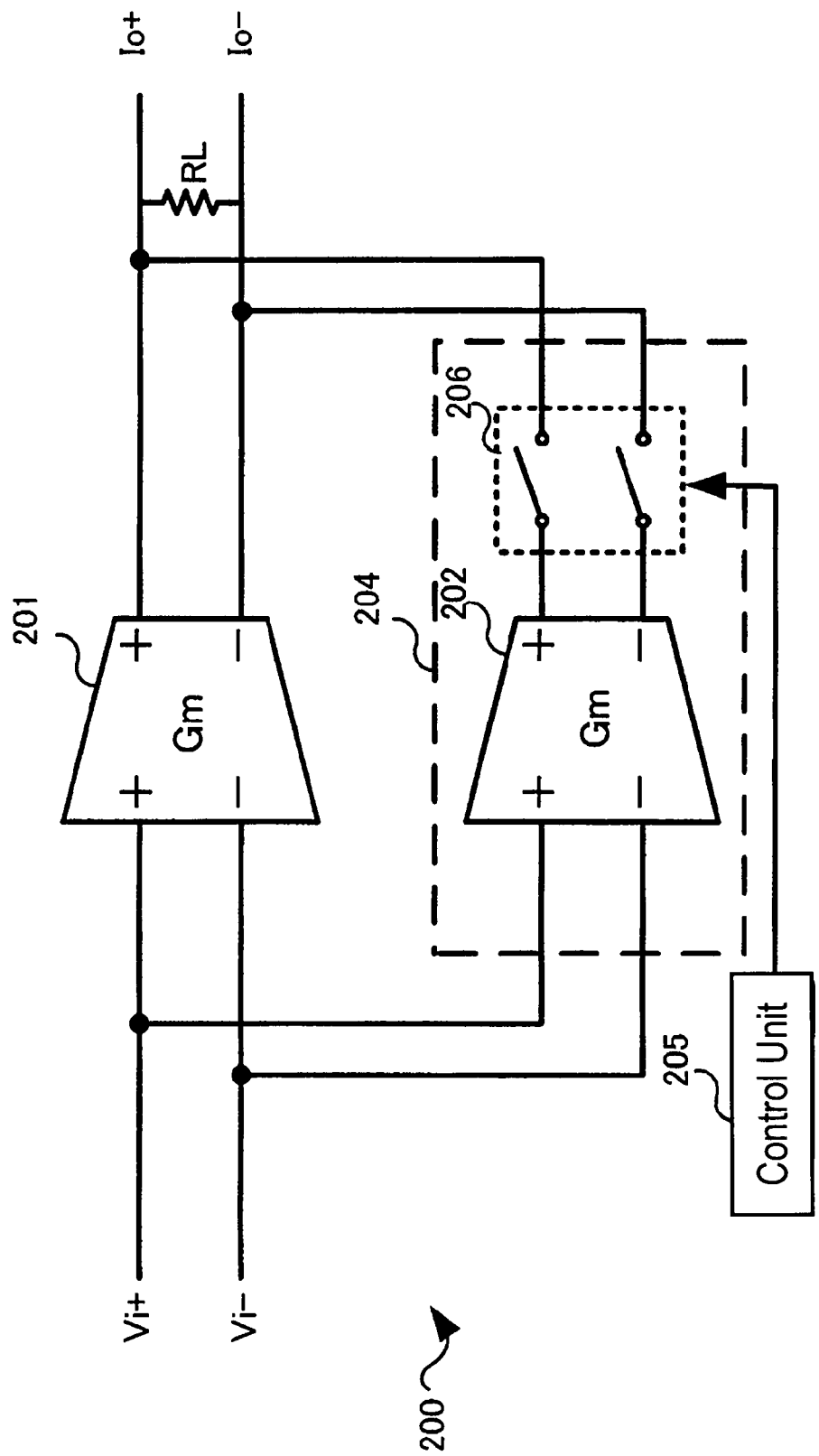
FIG. 4 is a diagram showing a configuration of an amplifier 200.

The phase characteristics of the amplifier 200 to adjust the gain by simply utilizing a switch as shown in FIG. 4 will be described.

The amplifier 200 of FIG. 4 generates positive-phase/negative phase output signals as amplifying positive-phase/negative-phase input signals. The amplifier 200 includes a first amplifier circuit 201 and a second amplifier circuit 204. The first amplifier circuit 201 outputs the first positive-phase/negative-phase signals as amplifying the positive-phase/negative-phase input signals. The second amplifier circuit 204 generates the second positive-phase/negative-phase signals as amplifying the positive-phase/negative-phase input signals. The second amplifier 204 includes a first amplifier unit 202 and a switch 206. The switch 206 is arranged between positive-phase/negative-phase output terminals of the first amplifier unit 202 and the positive-phase/negative-phase output terminals Io+, Io− of the amplifier 200. The switch 206 performs ON-OFF operation corresponding to instructions of a control unit 205. When the switch 206 is OFF, since the second amplifier circuit 204 does not output the second positive-phase/negative-phase signals, the positive-phase/negative-phase output signals of the amplifier 200 are to be the first positive-phase/negative-phase signals only. Meanwhile, when the switch 206 is ON, since the second amplifier circuit 204 outputs the second positive-phase/negative-phase signals, the positive output signal of the amplifier 200 is to be the sum of the first positive-phase signal and the second positive-phase signal. The negative output signal of the amplifier 200 is to be the sum of the first negative-phase signal and the second negative-phase signal. A load resistance RL is connected between the positive-phase output terminal Io+ and the negative-phase output terminal Io−.

Figure 5:
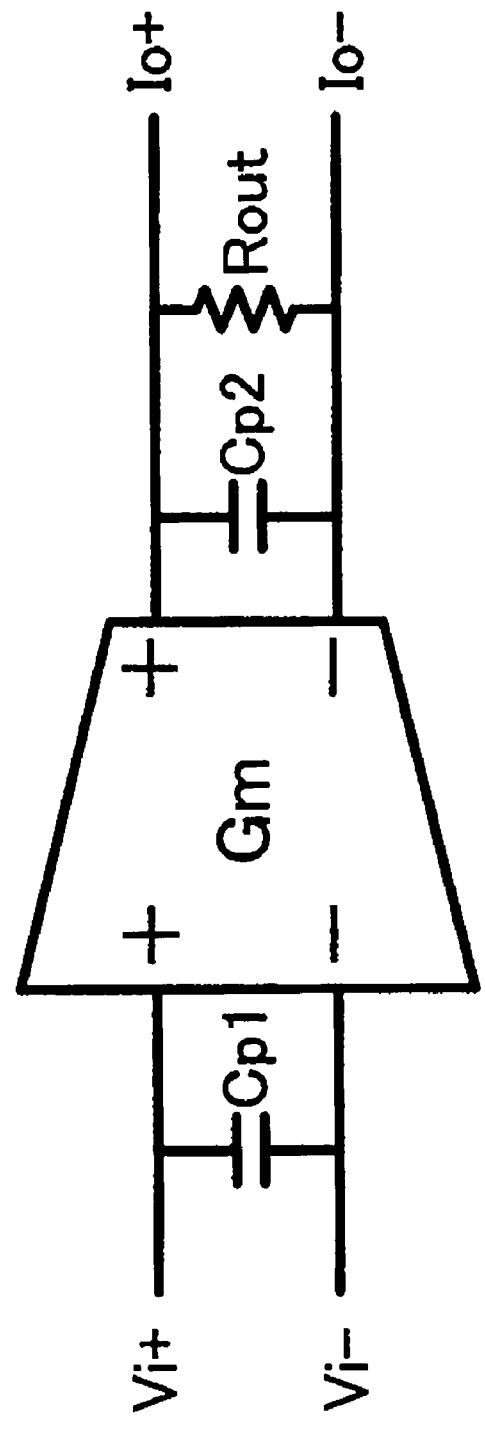
FIG. 5 is a diagram showing a parasitic capacitor and an output resistance in a first amplifier circuit 201.

Next, the transfer function of the amplifier 200 will be calculated. First, it is assumed that parasitic capacitors and output resistance as shown in FIG. 5 are generated at the first amplifier circuit 201 and the first amplifier unit 202 of the second amplifier circuit 204, respectively. At both the first amplifier circuit 201 and the first amplifier unit 202, a parasitic capacitor Cp1 is generated at the side of the positive-phase/negative-phase input terminals Vi+, Vi− and a parasitic capacitor Cp2 is generated at the side of the positive-phase/negative-phase output terminals Io+, Io−. An output resistance Rout is generated at the first amplifier circuit 201 and the first amplifier unit 202, respectively.

Here, the transfer function when the switch 206 is OFF is calculated. An impedance Zout1 connected between the positive-phase/negative-phase output terminals of the amplifier 200 is expressed by Equation (1).

$$Z_{out1} = R_{out} \mathbin{/\mkern-5mu/} \frac{1}{sC_{p2}} \mathbin{/\mkern-5mu/} R_L = \frac{R_{out} R_L}{R_{out} + R_L + sC_{p2} R_{out} R_L} \quad (1)$$

As expressed by Equation (2), a voltage gain A1 is acquired by multiplying the impedance Zout1 by the transconductance value gm of the first amplifier circuit 201.

$$A_1 = g_m Z_{out1} = \frac{g_m R_{out} R_L}{R_{out} + R_L + sC_{p2} R_{out} R_L} \quad (2)$$

Low-frequency voltage gain $A_{DC1}$ and cutoff angular frequency $\omega_{p1}$ are acquired respectively as expressed by Equation (3) being calculated from Equation (2).

$$A_{DC1} = \frac{g_m R_{out} R_L}{R_{out} + R_L} \quad (3)$$

$$\omega_{p1} = \frac{R_{out} + R_L}{C_{p2} R_{out} R_L}$$

Next, the transfer function when the switch 206 is ON is calculated. Impedance Zout2 connected between the positive-phase/negative-phase output terminals is expressed by Equation (4).

$$z_{out2} = \left(R_{out} \mathbin{/\mkern-5mu/} \frac{1}{sC_{p2}}\right) \mathbin{/\mkern-5mu/} \left(R_{out} \mathbin{/\mkern-5mu/} \frac{1}{sC_{p2}}\right) \mathbin{/\mkern-5mu/} R_L \quad (4)$$

$$= \frac{R_{out} R_L / 2}{R_{out}/2 + R_L + sC_{p2} R_{out} R_L}$$

As expressed by Equation (5), voltage gain A2 is acquired by multiplying the impedance Zout2 by the transconductance value gm of the first amplifier circuit 201 and the first amplifier unit 202.

$$A_2 = 2g_m Z_{out2} = \frac{g_m R_{out} R_L}{R_{out}/2 + R_L + sC_{p2} R_{out} R_L} \quad (5)$$

Low-frequency voltage gain $A_{DC2}$ and cutoff angular frequency $\omega_{p2}$ are acquired respectively as expressed by Equation (6) being calculated from Equation (5).

$$A_{DC2} = \frac{g_m R_{out} R_L}{R_{out}/2 + R_L} \quad (6)$$

$$\omega_{p2} = \frac{R_{out}/2 + R_L}{C_{p2} R_{out} R_L}$$

Next, the low-frequency gain values ($A_{DC1}$, $A_{DC2}$) and the cutoff angular frequencies ($\omega_{p1}$, $\omega_{p2}$) expressed by Equations (3) and (6) are compared respectively. Here, the first amplifier circuit 201 and the first amplifier unit 202 have the same transconductance value of gm. Therefore, when the amplifier 200 ideally operates, the low-frequency gain when the switch 206 is ON is required to be twice as large as that when the switch 206 is OFF. That is, an equation of $2AD_{C1}=AD_{C2}$ is required to be satisfied. However, as can be seen from Equations (3) and (6), in order to satisfy the equation of $2AD_{C1}=AD_{C2}$, the output resistance Rout is required to be infinite. Even for the case of $2A_{DC1} \approx A_{DC2}$, the output resistance Rout is required to be sufficiently high compared to the load resistance RL. In order to increase the output resistance Rout, it is necessary to utilize cascode connection or negative feedback. As a result, the circuit size and current consumption are increased.

Next, the cutoff frequency is calculated. In order to simplify description, the output resistance Rout is assumed to be sufficiently high. Cutoff frequency comparison is performed on the assumption that the output resistance Rout is infinite. When the cutoff frequencies are calculated on the assumption that the output resistance Rout is infinite, Equations (3) and (6) are expressed respectively by Equation (7).

$$\omega'_{p1} = \frac{1}{C_{p2} R_L} \quad (7)$$

$$\omega'_{p2} = \frac{1}{2 C_{p2} R_L}$$

In a system having a single pole, signal delay time within a pass-band frequency is approximately expressed by the inverse of angular frequency of the pole. Accordingly, it is understood that the phase characteristics are varied between the ON-state and the OFF-state of the switch 206.

In the above, description is performed on the influence of non-ideal factors such as parasitic capacitor and output resistance of the transconductance amplifier circuit to the low-frequency gain and pole angular frequency of the amplifier 200 having the amplifier 200 as an example. Depending on required variable accuracy of the amplifier gain and bandwidth, it is not necessary to consider influence of the non-ideal factors. However, the amplifier having high accuracy and wide-bandwidth is potentially required not to be influenced by the non-ideal factors.

Next, phase characteristics of the amplifier 100 according to the first embodiment will be described. It is assumed that the parasitic capacitors and output resistance as shown in FIG. 5 are generated at the first amplifier circuit 101 and the first and second amplifier units 102, 103 of the amplifier 100 of FIG. 1. The first amplifier circuit 101 has the transconductance value being three times as large as that of the first and second amplifier units 102, 103. Accordingly, the low-frequency gain and the cutoff angular frequency are calculated by utilizing an equivalent circuit in which the parasitic capacitor of FIG. 5 is changed to be three times large and the output resistance is changed to be one third.

Next, output impedance Zout3 in the case of adding the load resistance RL to the circuit of FIG. 1 is calculated. In the amplifier 100, whichever is activated or deactivated between the second and third current sources 122, 132, the first amplifier circuit 101 and either of the first and second amplifier units 102, 103 are connected to the positive-phase/negative phase output terminals. Accordingly, the parasitic capacitor and output resistance value connected to the positive-phase/negative-phase output terminals of the amplifier 100 are not varied even when the gain of the amplifier 100 is varied. The impedance Zout3 connected between the positive-phase/negative-phase output terminals is expressed by Equation (8).

$$Z_{out3} = \left(\frac{R_{out}}{3} // \frac{1}{3sC_{p2}}\right) // \left(R_{out} // \frac{1}{sC_{p2}}\right) // R_{out} \quad (8)$$

In the case that the second current source 122 is activated, the transconductance value of the amplifier 100 is to be 4gm (=3gm+gm). In the case that the third current source 132 is activated, the transconductance value of the amplifier 100 is to be 2gm (=3gm−gm). That is, when the second current source 122 is switched off and the third current source 132 is switched on, the transconductance value of the amplifier 100 is varied to be double or to be half. Here, the transconductance value does not include s. Accordingly, provided that the output impedance value Zout3 is not varied irrespective of the gain, the phase characteristics are not varied as well. That is, the gain of the amplifier 100 is determined only by the transconductance values of the first amplifier circuit 101 and the first and second amplifier units 102, 103. Accordingly, with the amplifier 100, the gain can be accurately varied and the phase characteristics can be maintained constant irrespective of the gain.

As described above, in the amplifier 100 according to the first embodiment, the second amplifier circuit 104 includes the first and second amplifier units 102, 103 and the control unit 105 controls the second amplifier circuit 104. Accordingly, either the sum of the first positive-phase signal and the second positive-phase signal or the sum of the first positive-phase signal and the third negative-phase signal is output from the positive-phase output terminal Io+. Further, either the sum of the first negative-phase signal and the second negative-phase signal or the sum of the first negative-phase signal and the third positive-phase signal is output from the negative-phase output terminal Io−. As described above, in the amplifier 100, the positive-phase/negative-phase output terminals are always connected to either of the first and second amplifier units 102, 103, respectively by varying the gain utilizing the sum of the positive-phase/negative-phase signals without arranging the switch 206. Accordingly, the amplifier 100 is capable of maintaining phase characteristics constant irrespective of the gain. Therefore, the amplifier 100 is capable of maintaining the phase characteristics constant without utilizing a compensation circuit. As a result, the amplifier 100 can compensate the phase characteristics with a small-sized circuit.

Description of the Second Embodiment

Figure 6:
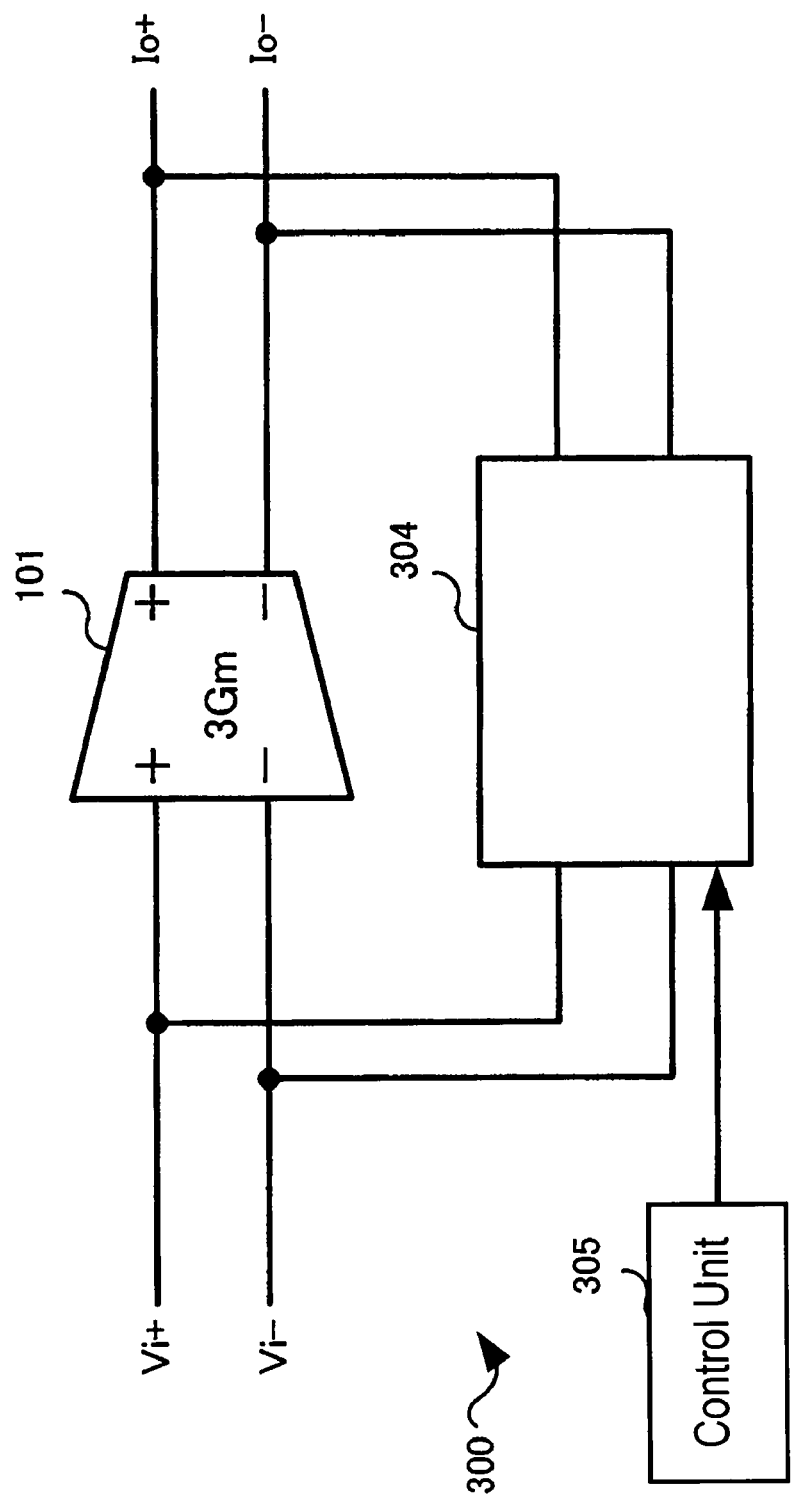
FIG. 6 is a diagram showing a configuration of an amplifier 300 according to a second embodiment.

An amplifier 300 according to the second embodiment will be described with reference to FIG. 6. In the amplifier 300 according to the second embodiment, the configuration and operation of a second amplifier circuit 304 and a control unit 305 are different from those of the amplifier 100 of FIG. 1. As shown in FIG. 6, the control unit 305 generates a control signal and outputs to the second amplifier circuit 304.

Figure 7:
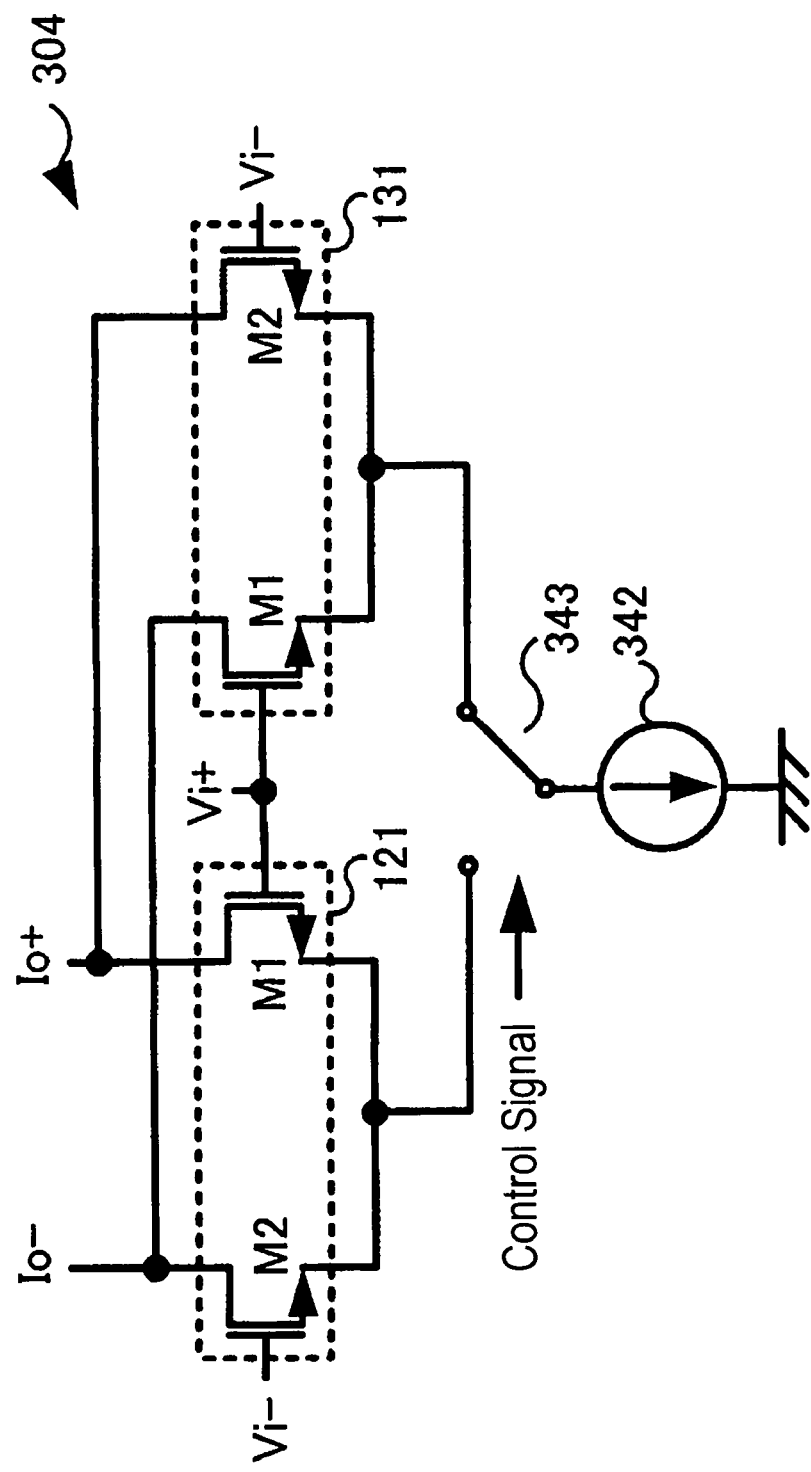
FIG. 7 is a diagram showing an example of a second amplifier circuit 304.

The second amplifier circuit 304 will be described with reference to FIG. 7. Except for having a forth current source 342 and a switch 343 instead of the second and third current sources 122, 132, the second amplifier circuit 304 has the same configuration as the second amplifier circuit 104 of FIG. 3.

One end of the fourth current source 342 is connected to a first pair of transistors 121 or a second pair of transistors 131 via the switch 343. The other end of the fourth current source 342 is grounded. The switch 343 connects the fourth current source 342 to either of the first pair of transistors 121 or the second pair of transistors 131 corresponding to the control signal. When the control unit 305 selects the first pair of transistors 121, the fourth current source 342 and the first pair of transistors 121 are connected via the switch 343. As a result, the fourth current source 342 and the first pair of transistors 121 operate as the first amplifier unit. Meanwhile, when the control unit 305 selects the second pair of transistors 131, the fourth current source 342 and the second pair of transistors 131 are connected via the switch 343. As a result, the fourth current source 342 and the second pair of transistors 131 operate as the second amplifier unit.

As described above, the amplifier 300 of the second embodiment can obtain similar effects to those of the first embodiment. In addition, through the shared use of the fourth current source 342 to the first and second amplifier units, circuit area of the second amplifier circuit 304 can be reduced in the amplifier 300.

Description of the Third Embodiment

Figure 8:
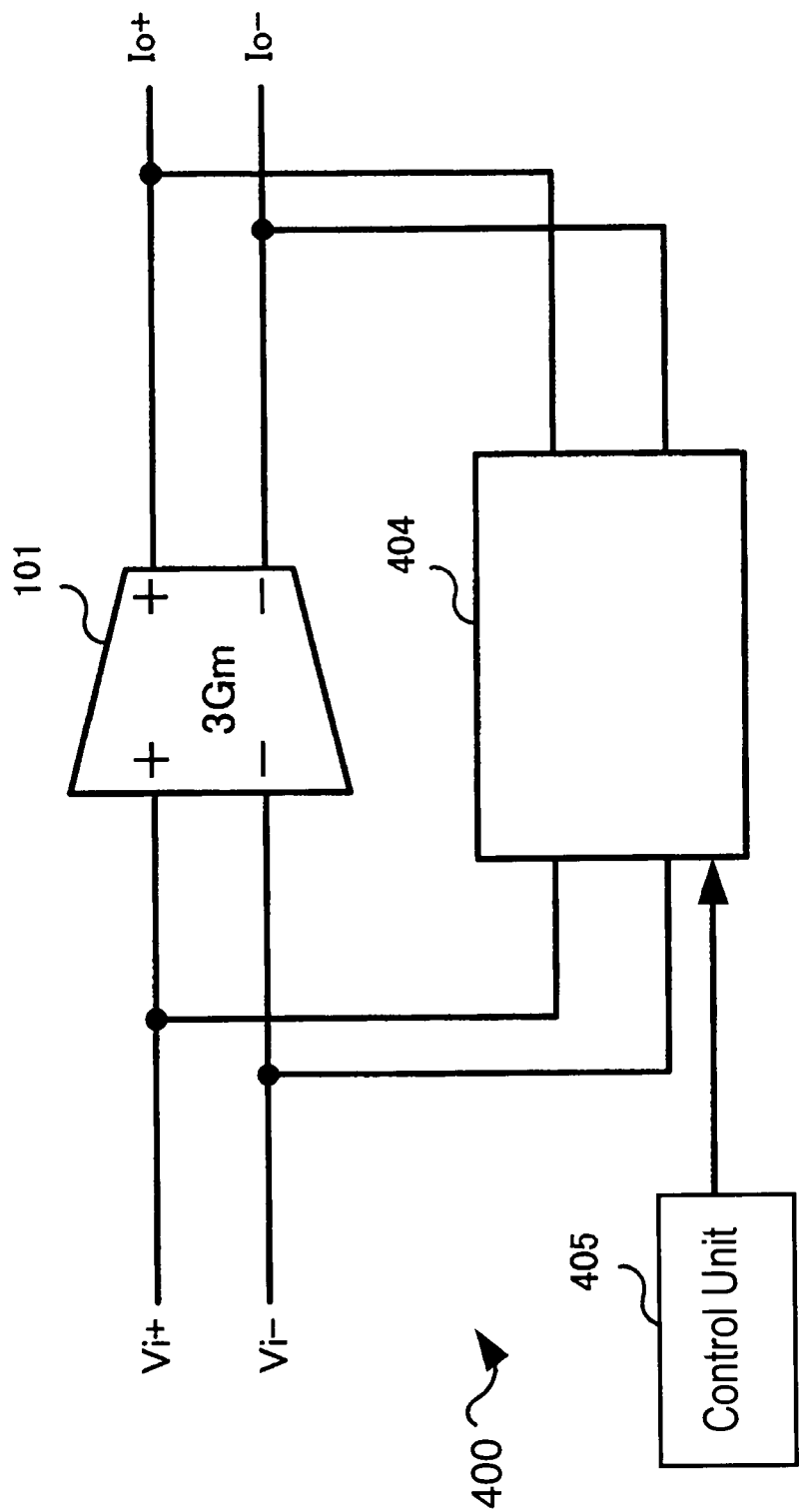
FIG. 8 is a diagram showing a configuration of an amplifier 400 according to a third embodiment.

An amplifier 400 according to the third embodiment will be described with reference to FIG. 8. The configuration and operation of a second amplifier circuit 404 of the amplifier 400 are different from those of the second amplifier circuit 304 of the amplifier 300 of FIG. 6.

Figure 9:
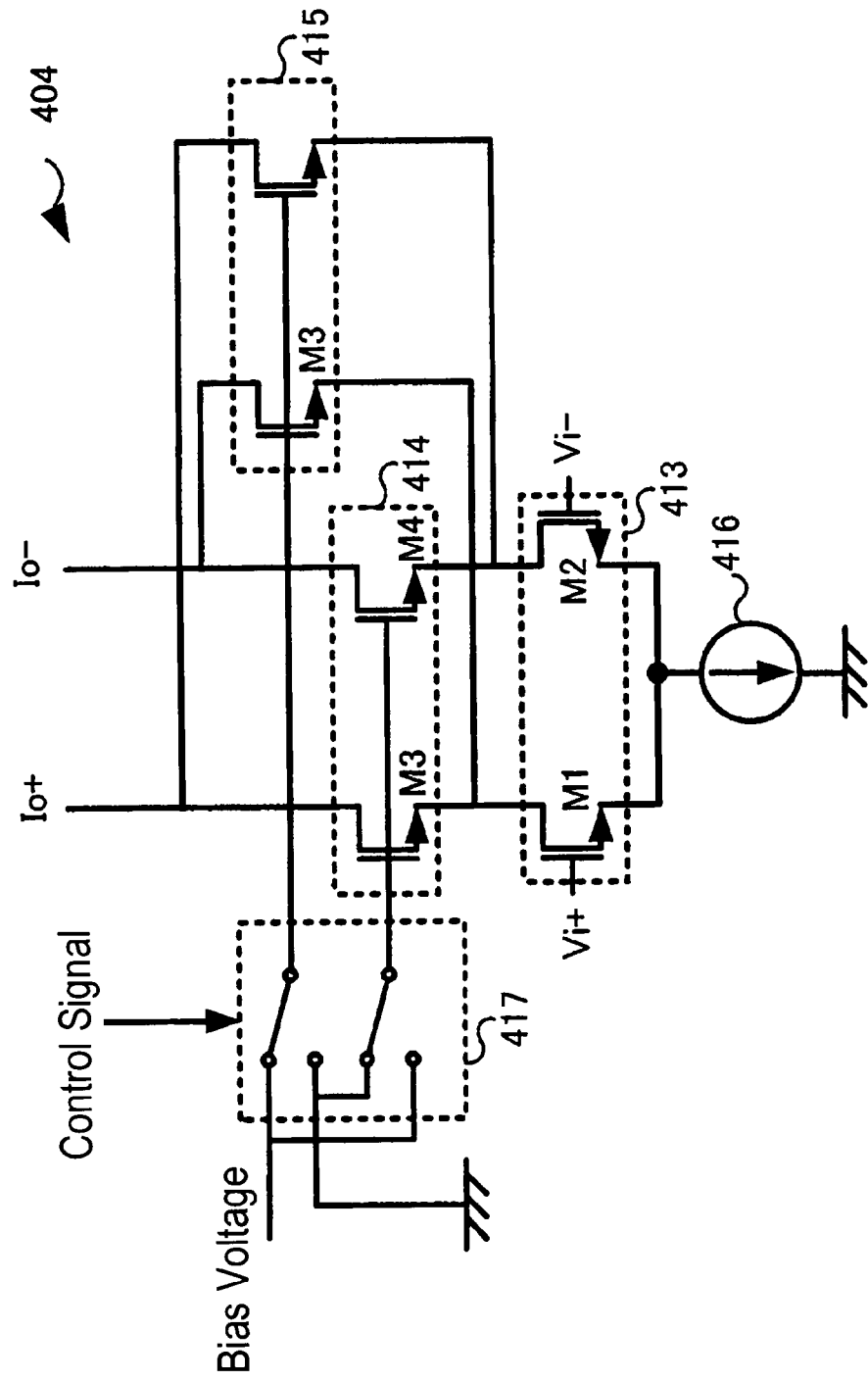
FIG. 9 is a diagram showing an example of a second amplifier circuit 404.

The second amplifier circuit 404 will be described with reference to FIG. 9. The second amplifier circuit 404 includes third to fifth pairs of transistors 413 to 415, a fifth current source 416 and a switch 417. Here, a control unit 405 controls the switch 417 as generating a control signal corresponding to a gain actualized by the amplifier 400.

The third pair of transistors 413 includes first and second transistors M1, M2. The fourth and fifth pairs of transistors 414, 415 include third and fourth transistors M3, M4, respectively. A gate terminal of the first transistor M1 is connected to the positive-phase input terminal Vi+. A drain terminal of the first transistor M1 is connected to respective source terminals of the third transistor M3 of the fourth and fifth pairs of transistors 414, 415. A source terminal of the first transistor M1 is connected to the fifth current source 416. A gate terminal of the second transistor M2 is connected to the negative-phase input terminal Vi−. A drain terminal of the second transistor M2 is connected to respective source terminals of the fourth transistor M4 of the fourth and fifth pairs of transistors 414, 415. A source terminal of the second transistor M2 is connected to the fifth current source 416.

In the fourth pair of transistors 414, a gate terminal of the third transistor M3 is connected to one end of the switch 417. A drain terminal of the third transistor M3 is connected to the positive-phase output terminal Io+. In the fourth pair of transistors 414, a gate terminal of the fourth transistor M4 is connected to one end of the switch 417. A drain terminal of the fourth transistor M4 is connected to the negative-phase output terminal Io−.

In the fifth pair of transistors 415, a gate terminal of the third transistor M3 is connected to one end of the switch 417. A drain terminal of the third transistor M3 is connected to the negative-phase output terminal Io−. In the fifth pair of transistors 415, a gate terminal of the fourth transistor M4 is connected to one end of the switch 417. A drain terminal of the fourth transistor M4 is connected to the positive-phase output terminal Io+.

One end of the fifth current source 416 is connected to the third pair of transistors 413. The other end of the fifth current source 416 is grounded. One end of the switch 417 is connected to the fourth and fifth pairs of transistors 414, 415. The other end of the switch 417 is connected to a bias voltage generating unit (not shown) or to ground.

In the case that the second positive-phase/negative-phase signals are to be output from the second amplifier circuit 404, the switch 417 connects the fourth pair of transistors 414 to the bias voltage generating unit (not shown) corresponding to the control signal generated by the control unit 415. Further, the switch 417 connects the fifth pair of transistors 415 to ground. Accordingly, bias voltage is supplied to the fourth pair of transistors 414. As a result, the circuit including the third pair of transistors 413, the forth pair of transistors 414 and the fifth current source 416 operates as the first amplifier unit.

On the other hand, in the case that the third positive-phase/negative-phase signals are to be output from the second amplifier circuit 404, the switch 417 connects the fourth pair of transistors 414 to ground corresponding to the control signal. Further, the switch 417 connects the fifth pair of transistors 415 to the bias voltage generating unit (not shown). Accordingly, bias voltage is supplied to the fifth pair of transistors 415. As a result, the circuit including the third pair of transistors 413, the fifth pair of transistors 415 and the fifth current source 416 operates as the second amplifier unit.

As described above, the amplifier 400 of the third embodiment can obtain similar effects to those of the first embodiment. In addition, since the second amplifier circuit 404 of the amplifier 400 includes the fourth and fifth pairs of transistors 414, 415 which are cascode-connected to the third pair of transistors 413, the first and second amplifier units can share the current source and the pair of transistors. Further, since the fourth and fifth pairs of transistors 414, 415 are cascade-connected to the third pair of transistors 413, the output impedance of the second amplifier circuit 404 (specifically, the circuit operating as the first and second amplifier units) can be increased. Furthermore, the signal to be output from the second amplifier circuit 404 is switched by switching to supply the bias voltage to which of the fourth and fifth pairs of transistors 414, 415. Accordingly, with the amplifier 400, by making use of cascade structure distortion caused by output resistance variation of third pair of transistors 413 can be reduced.

Description of the Fourth Embodiment

An amplifier 500 according to the fourth embodiment will be described with reference to FIG. 10. The amplifier 500 is different from the amplifier 100 of FIG. 1 in the point of including the third to nth amplifier circuits 503 to 50n (n is an integer equal to or larger than three).

The k-th amplifier circuit $50k$ includes a first amplifier unit $102\text{-}k$ of the k-th and a second amplifier unit $103\text{-}k$ of the k-th. Since the circuit configuration of the k-th amplifier circuit $50k$ is the same as that of the second amplifier circuit 104 in FIG. 3, description will not be repeated. The first amplifier unit $102\text{-}k$ of the k-th generates second positive-phase/negative-phase signals of the k-th as amplifying the positive-phase/negative-phase input signals. The second amplifier unit $103\text{-}k$ of the k-th generates third positive-phase/negative-phase signals of the k-th as amplifying the positive-phase/negative-phase input signals.

Transconductance values of the first and second amplifier units $102\text{-}k$, $103\text{-}k$ of the k-th are different from those of the first and second amplifier units 102, 103 of the second amplifier circuit 104.

(In the Case of n=3)

The amplifier 500 includes the first amplifier circuit 101, the second amplifier circuit 104 and a third amplifier circuit 503. Here, the transconductance value gm1 of the first amplifier circuit 101 is assumed to be five times, for example, as large as a transconductance value gm3 of the first and second amplifier units 102-3, 103-3 (i.e., gm1=5×gm3) included in the third amplifier circuit 503. Further, the transconductance value gm2 of the first and second amplifier units 102, 103 included in the second amplifier circuit 104 is assumed to be twice as large as a transconductance value gm3 of the first and second amplifier units 102-3, 103-3 (i.e., gm2=2×gm3) included in the third amplifier circuit 503.

A control unit 505 of the amplifier 500 selects either the first amplifier unit 102 or the second amplifier unit 103 of the second amplifier circuit 104 and controls the second amplifier circuit 104 so that the second amplifier circuit 104 outputs the signals (i.e., the second positive-phase/negative-phase signals or the third positive-phase/negative-phase signals) amplified by either the first amplifier unit 102 or the second amplifier unit 103. Similarly, the control unit 505 selects either the first amplifier unit 102-3 or the second amplifier unit 103-3 of the third amplifier circuit 503 and controls the third amplifier circuit 503 so that the third amplifier circuit 503 outputs the signals (i.e., the second positive-phase/negative-phase signals of the third or the third positive-phase/negative-phase signals of the third) amplified by either the first amplifier unit 102-3 of the third or the second amplifier unit 103-3 of the third.

In the case that the control unit 505 selects the second amplifier unit 103 of the second amplifier circuit 104 and the second amplifier unit 103-3 of the third amplifier circuit 503, the amplifier 500 outputs the sum of the first positive-phase signal, the third negative-phase signal, and the third negative-phase signal of the third as the positive-phase output signal. Further, the amplifier 500 outputs the sum of the first negative-phase signal, the third positive-phase signal, and the third positive-phase signal of the third as the negative-phase output signal. The transconductance value gm of the entire amplifier 500 is to be 2×gm3 (=5×gm3−2×gm3−gm3).

In the case that the control unit 505 selects the second amplifier unit 103 of the second amplifier circuit 104 and the first amplifier unit 102-3 of the third amplifier circuit 503, the amplifier 500 outputs the sum of the first positive-phase signal, the third negative-phase signal, and the second positive-phase signal of the third as the positive-phase output signal. Further, the amplifier 500 outputs the sum of the first negative-phase signal, the third positive-phase signal, and the second negative-phase signal of the third as the negative-phase output signal. The transconductance value gm of the entire amplifier 500 is to be 4×gm3 (=5×gm3−2×gm3+gm3). The gain of the amplifier 500 is to be twice as large as that in the case of selecting the second amplifier unit 103 and the second amplifier unit 103-3 of the third.

As described above, due to the control of the second amplifier circuit and the second amplifier circuit of the third by the control unit 505, the gain of the amplifier 500 can be varied to be 0 dB, 6 dB and 12 dB having the minimum value of the gain specified to be 0 dB. Further, the positive-phase/negative-phase output terminals are always connected respectively to either of the first and second amplifier units 102, 103 of the second amplifier circuit 104 and to either of the first and second amplifier units 102-3, 103-3 of the third amplifier circuit 503. Accordingly, with the amplifier 500, the gain can be accurately varied and the phase characteristics can be maintained constant irrespective of the gain.

Besides the abovementioned example, the transconductance value gm1 of the first amplifier circuit 101 may be seven and half times, for example, as large as the transconductance value gm3 of the first and second amplifier units 102-3, 103-3 included in the third amplifier circuit 503 (i.e., 2gm1=15×gm3) and the transconductance value gm2 of the first and second amplifier units 102, 103 included in the second amplifier circuit 104 may be one and half times, for example, as large as the transconductance value gm3 of the first and second amplifier units 102-3, 103-3 included in the third amplifier circuit 503 (i.e., 2gm2=3×gm3). Here, the ratio is expressed as gm1:gm2:gm3=15:3:2. In the case, the gain of the amplifier 500 can be varied to be 0 dB, 3 dB and 6 dB having the minimum value of the gain specified to be 0 dB.

(In the Case of n=4)

Here, n may be larger than three. In the case of n=4, for example, the ratio among the transconductance value gm1 of the first amplifier circuit 101, the transconductance value gm2 of the first and second amplifier units 102, 103 included in the second amplifier circuit 104, the transconductance value gm3 of the first and second amplifier units 102-3, 103-3 included in the third amplifier circuit 503, and a transconductance value gm4 of first and second amplifier units 102-4, 103-4 included in a fourth amplifier circuit 504 is set to satisfy gm1:gm2:gm3:gm4=9:4:2:1. In the case, the gain of the amplifier 500 can be varied to be 0 dB, 6 dB, 12 dB and 18 dB having the minimum value of the gain specified to be 0 dB. Further, as another example of the case of n=4, the ratio may be set to satisfy gm1:gm2:gm3:gm4=45:6:5:4. In the case, the gain of the amplifier 500 can be varied to be 0 dB, 2 dB, 4 dB and 6 dB having the minimum value of the gain specified to be 0 dB.

(In the Case of n=7)

In the case of n=7, the transconductance values of the first to seventh amplifier circuits are denoted by gm1 to gm7, respectively. The transconductance values of the second to seventh amplifier circuits are transconductance values of the respective amplifier units included in the second to seventh amplifier circuits. The ratio among the transconductance values of the first to seventh circuits is set to satisfy gm1:gm2:gm3:gm4:gm5:gm6:gm7=45:3:3:3:2:2:2. In the case, the gain of the amplifier 500 can be varied to be 0 dB, 1 dB, 2 dB, 3 dB, 4 dB, 5 dB and 6 dB having the minimum value of the gain specified to be 0 dB.

As described above, with the amplifier 500 according to the fourth embodiment, the gain can be varied in a multi-step manner by arranging the k-th amplifier circuit 50k. Further, when the k-th amplifier circuit 50k is configured to be the same as the second amplifier circuit 104 and the control unit 505 is configured to always select either of the first amplifier unit 102-k or the second amplifier unit 103-k of the k-th, similar effects to the first embodiment can be obtained.

Figure 10:
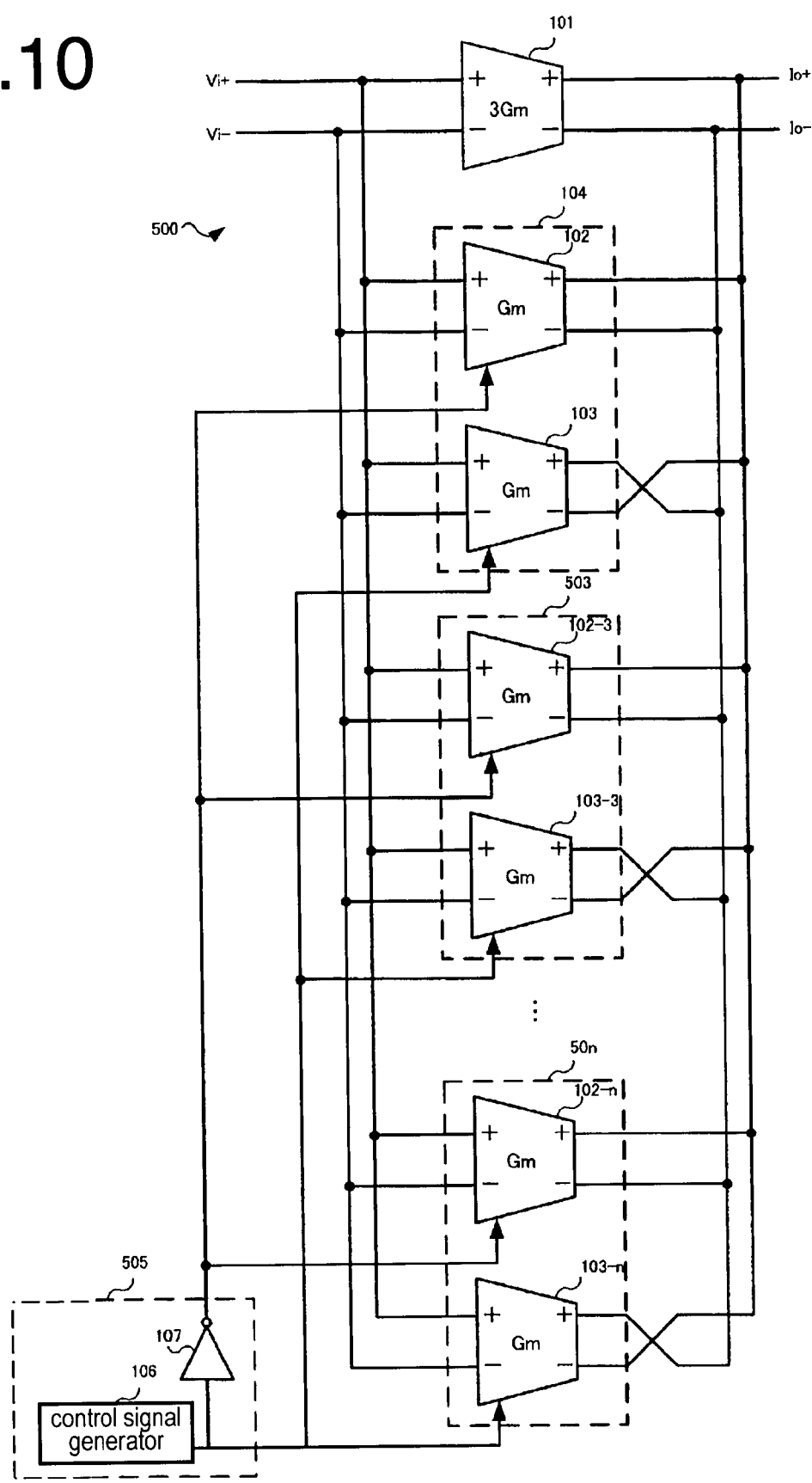
FIG. 10 is a diagram showing a configuration of an amplifier 500 according to a fourth embodiment.

In the description with FIG. 10, the second amplifier circuit 104 and the k-th amplifier circuit 50k have the configuration of FIG. 3. Instead, the circuit configuration similar to the amplifier circuit of FIGS. 7 and 9 may be adopted.

Description of the Fifth Embodiment

Figure 11:
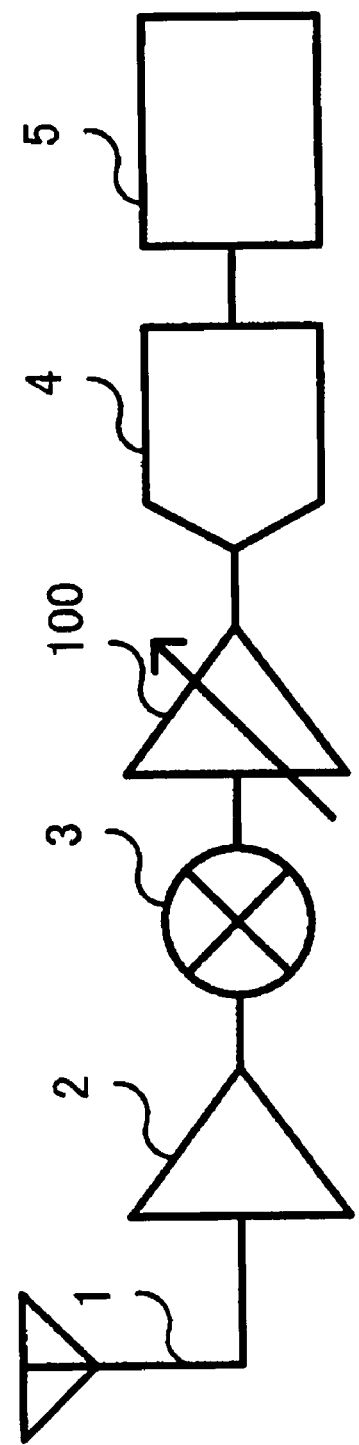
FIG. 11 is a diagram showing a configuration of a communication apparatus according to a fifth embodiment.

FIG. 11 is a configuration diagram of a communication device according to the fifth embodiment. The communication device includes an antenna 1, a low noise amplifier 2, a mixer 3, the amplifier 100 of the first embodiment shown in FIG. 1, an A/D (analog/digital) converter 4, and a signal processing unit 5.

The antenna 1 receives an radio signal. The low noise amplifier 2 amplifies the radio signal received by the antenna 1. The mixer 3 down-converts the radio signal with a local signal to an analog baseband signal. The amplifier 100 amplifies the analog baseband signal from the mixer 3. The A/D converter 4 converts the analog baseband signal from the amplifier 100 to a digital baseband signal. The digital signal processing circuit 5 performs baseband signal processing for the digital baseband signal from the A/D converter 4. The signal processing unit 5 performs demodulation and error correction to obtain a received signal. The gain of the amplifier 100 varies not to saturate the A/D converter 4 according to a level of the analog baseband signal inputted into the amplifier 100.

According to the fifth embodiment, the communication device using the amplifier 100 compensates a phase characteristic of the analog baseband signal without having a correction circuit after the amplifier 100. As a result, circuit size of the communication device can be smaller.

While certain embodiments have been described, these embodiments have been presented by way of example only, and are not intended to limit the scope of the inventions. Indeed, the novel systems described herein may be embodied in a variety of other forms; furthermore, various omissions, substitutions and changes in the form of the methods and systems described herein may be made without departing from the sprit of the inventions. The accompanying claims and their equivalents are intended to cover such forms or modifications as would fall within the scope and spirit of the inventions.

What is claimed is:

1. An amplifier for amplifying a positive-phase input signal to generate a positive-phase output signal and amplifying a negative-phase input signal to generate a negative-phase output signal, comprising:

a first amplifier circuit to amplify the positive-phase input signal in order to obtain a first positive-phase signal and to amplify the negative-phase input signal in order to obtain a first negative-phase signal; and a second amplifier circuit which includes a first amplifier unit and a second amplifier unit, the first amplifier unit amplifying the positive-phase input signal to obtain a second positive-phase signal and amplifying the negative-phase input signal to obtain a second negative-phase signal, the second amplifier unit amplifying the positive-phase input signal to obtain a third positive-phase signal and amplifying the negative-phase input signal to obtain a third negative-phase signal, wherein the positive-phase output signal is a sum of the first positive-phase signal and the second positive-phase signal while the negative-phase output signal is a sum of the first negative-phase signal and the second negative-phase signal, or the positive-phase output signal is a sum of the first positive-phase signal and the third negative-phase signal while the negative-phase output signal is a sum of the first negative-phase signal and the third positive-phase signal.

2. The amplifier of claim 1,
wherein one of the first amplifier unit and the second amplifier unit is activated and the other of the first amplifier unit and the second amplifier unit is deactivated.

3. The amplifier of claim 1,
wherein transconductance values of the first amplifier unit and the second amplifier unit are the same.

4. The amplifier of claim 1,
wherein output resistance values of the first amplifier unit and the second amplifier unit are the same.

5. The amplifier of claim 1, wherein
the first amplifier unit includes a first pair of transistors and a first current source,
the second amplifier unit includes a second pair of transistors and a second current source, and
one of the first current source and the second current source is activated and the other of the first current source and the second current source is deactivated.

6. The amplifier of claim 1, wherein
the second amplifier circuit includes a first pair of transistors, a second pair of transistors and a current source to supply current to either the first pair of transistors or the second pair of transistors,
the first amplifier unit includes the first pair of transistors and the current source, and the second amplifier unit includes the second pair of transistors and the current source.

7. The amplifier of claim 5, wherein
the second amplifier circuit further includes a third pair of transistors,
the first amplifier unit includes the first pair of transistors, the current source and the third pair of transistors, and
the second amplifier unit includes the second pair of transistors, the current source and the third pair of transistors.

8. The amplifier of claim 6, wherein
the second amplifier circuit generates the second positive-phase/negative-phase signals or the third positive-phase/negative-phase signals by applying bias voltage to the first pair of transistors or the second pair of transistors.

9. An amplifier for amplifying a positive-phase input signal to generate a positive-phase output signal and amplifying a negative-phase input signal to generate a negative-phase output signal, comprising:
a first amplifier circuit to amplify the positive-phase input signal in order to obtain a first positive-phase signal and to amplify the negative-phase input signal in order to obtain a first negative-phase signal;
a second amplifier circuit which includes a first amplifier unit and a second amplifier unit, the first amplifier unit amplifying the positive-phase input signal to obtain a second positive-phase signal and amplifying the negative-phase input signal to obtain a second negative-phase signal, the second amplifier unit amplifying the positive-phase input signal to obtain a third positive-phase signal and amplifying the negative-phase input signal to obtain a third negative-phase signal, and
a third amplifier circuit which includes a third amplifier unit and a fourth amplifier unit, the third amplifier unit amplifying the positive-phase input signal to obtain a fourth positive-phase signal and amplifying the negative-phase input signal to obtain a fourth negative-phase signal, the fourth amplifier unit amplifying the positive-phase input signal to obtain a fifth positive-phase signal and amplifying the negative-phase input signal to obtain a fifth negative-phase signal,
wherein
the positive-phase output signal is a sum of the first positive-phase signal and the second positive-phase signal and the fourth positive-phase signal while the negative-phase output signal is a sum of the first negative-phase signal and the second negative-phase signal and the fourth negative-phase signal,
or the positive-phase output signal is a sum of the first positive-phase signal and the third negative-phase signal and the fourth positive-phase signal while the negative-phase output signal is a sum of the first negative-phase signal and the third positive-phase signal and the fourth negative-phase signal,
or the positive-phase output signal is a sum of the first positive-phase signal and the third negative-phase signal and the fifth negative-phase signal while the negative-phase output signal is a sum of the first negative-phase signal and the third positive-phase signal and the fifth positive-phase signal.

10. A communication apparatus comprising:
an antenna to receive a radio signal;
the amplifier of claim 1 to amplify the radio signal; and
a receiving unit to perform signal processing on the radio signal being amplified to obtain a reception signal.

* * * * *